(12) United States Patent
Yugou et al.

(10) Patent No.: US 8,508,232 B2
(45) Date of Patent: Aug. 13, 2013

(54) BATTERY SYSTEM WITH A CURRENT DETECTION CIRCUIT

(75) Inventors: Masaki Yugou, Kakogawa (JP); Kimihiko Furukawa, Kakogawa (JP); Yutaka Yamauchi, Himeji (JP)

(73) Assignee: Sanyo Electric Co., Ltd., Osaka (JP)

( * ) Notice: Subject to any disclaimer, the term of this patent is extended or adjusted under 35 U.S.C. 154(b) by 504 days.

(21) Appl. No.: 12/876,311

(22) Filed: Sep. 7, 2010

(65) Prior Publication Data
US 2011/0057658 A1 Mar. 10, 2011

(30) Foreign Application Priority Data

Sep. 7, 2009 (JP) .................................. 2009-206281

(51) Int. Cl.
*G01N 27/416* (2006.01)
*G01R 31/36* (2006.01)
(52) U.S. Cl.
CPC .................................. *G01R 31/3648* (2013.01)
USPC ........................................................ 324/426
(58) Field of Classification Search
None
See application file for complete search history.

(56) References Cited

U.S. PATENT DOCUMENTS

| 4,728,898 | A | * | 3/1988 | Staley, Jr. ...................... 324/522 |
| 5,422,822 | A | * | 6/1995 | Toyota et al. .................... 702/63 |
| 5,691,078 | A | * | 11/1997 | Kozaki et al. .................. 324/428 |
| 6,701,262 | B2 | * | 3/2004 | Mizuno et al. .................. 702/60 |
| 7,403,016 | B2 | | 7/2008 | Furukawa et al. |

FOREIGN PATENT DOCUMENTS

| JP | 2003014825 A | * | 1/2003 |
| JP | 2003-47111 | | 2/2003 |
| JP | 2006-14480 | | 1/2006 |
| JP | 2009-139223 | | 6/2009 |

* cited by examiner

*Primary Examiner* — Paresh Patel
(74) *Attorney, Agent, or Firm* — Wenderoth, Lind & Ponack, LLP

(57) ABSTRACT

The battery system has a current detection circuit 2, an amplifier 6, and a detection circuit 7 that detects the current flowing through batteries 1 from amplifier 6 output. The current detection circuit 2 is provided with a voltage source circuit 8 that supplies a test voltage to the input-side of the amplifier 6. Current detection lines 10 connect the current detection resistor 5 to the input-side of the amplifier 6, and the detection circuit 7 stores a reference voltage corresponding to the current detection lines 10 in the connected state. When the voltage source circuit 8 supplies the test voltage to the input-side of the amplifier 6, the detection circuit 7 compares the amplifier 6 output voltage with the reference voltage. The detection circuit 7 detects an open-circuit in the current detection lines 10 by the shift in voltage from the reference voltage.

17 Claims, 8 Drawing Sheets

BATTERY SYSTEM WITH A CURRENT DETECTION CIRCUIT

BACKGROUND OF THE INVENTION

1. Field of the Invention

The present invention relates to a battery system with a current detection circuit capable of extremely reliable current detection, and in particular relates to a battery system with a current detection circuit used as a power source apparatus in a vehicle such as a hybrid car or electric automobile (electric vehicle) optimally suited for stably detecting battery charging and discharging current.

2. Description of the Related Art

In a power source apparatus used in a vehicle such as a hybrid car, high reliability and high precision detection of battery charging and discharging current is in demand. This is because the vehicle cannot be driven by the batteries when the battery current cannot be detected. A state-of-the-art current detection circuit uses a difference amplifier to amplify the voltage across a current detection resistor in series with the batteries, and detects current from the output voltage of the difference amplifier. Current can be detected from the difference amplifier output voltage because the voltage across the current detection resistor is proportional to the current. To reduce power loss due to the voltage drop across the current detection resistor, the resistance of the current detection resistor is made extremely small. Since the voltage across the current detection resistor is proportional to the product of the resistance and the current, a small resistance means the voltage is also small. The small resistor voltage is amplified by the difference amplifier to detect the current.

This current detection circuit cannot determine if there is an open-circuit in the current detection lines that connect the current detection resistor to the difference amplifier inputs. This is because difference amplifier input voltage is zero when a current detection line is open-circuited, and difference amplifier input voltage is also zero when no current is flowing. Consequently, the absence of current flow cannot be distinguished from an open-circuited current detection line.

To resolve the drawback described above, the present applicant developed a battery system that can detect current detection line open-circuit. (Refer to Japanese Laid-Open Patent Publication 2009-139223.)

In the battery system of JP 2009-139223-A, current detection line open-circuit can be detected, but two high precision difference amplifiers are required. Accordingly, this system has the drawback that the circuit structure complexity and parts-cost increases.

The present invention was developed with the object of further correcting the drawbacks described above. Thus, it is a primary object of the present invention to provide a battery system with a current detection circuit that can detect current detection line open-circuit and can reliably and stably detect battery current with a simple circuit structure.

SUMMARY OF THE INVENTION

The battery system with a current detection circuit of the present invention is provided with a current detection circuit 2, 22 made up of a current detection resistor 5 connected in series with the batteries 1, an amplifier 6, 26 that amplifies the voltage induced across the terminals of the current detection resistor 5, and a detection circuit 7 that detects the current flowing through the batteries 1 from the amplifier 6, 26 output. The current detection circuit 2, 22 is provided with a voltage source circuit 8, 28 that supplies a test voltage to the input-side of the amplifier 6, 26. Current detection lines 10 connect the current detection resistor 5 to the input-side of the amplifier 6, 26, and the detection circuit 7 stores a reference voltage corresponding to the current detection lines 10 in the connected state. In this battery system, when the voltage source circuit 8, 28 supplies the test voltage to the input-side of the amplifier 6, 26, the detection circuit 7 compares the amplifier 6, 26 output voltage with the reference voltage. The detection circuit 7 detects an open-circuit in the current detection lines 10 by the shift in voltage from the reference voltage.

The battery system described above has the characteristic that it can detect current detection line open-circuit and can reliably and stably detect battery current with a simple circuit structure. This is because a test voltage is supplied to the input-side of the amplifier that amplifies the voltage induced across the current detection resistor, and the detection circuit that detects amplifier output voltage compares the amplifier output voltage with the reference voltage to detect current detection line open-circuit by the voltage shift from the reference voltage. This battery system detects current detection line open-circuit when no battery current is flowing. When there is no open-circuit in the current detection lines, the low resistance current detection resistor is connected to the input-side of the amplifier and the voltage input to the detection circuit is within the range of the reference voltage. When there is an open-circuit in the current detection lines, the low resistance current detection resistor is disconnected from the input-side of the amplifier and the voltage input to the detection circuit is not equal to the reference voltage. Therefore, the detection circuit can reliably detect an open-circuit in the current detection lines by comparing the input voltage with the reference voltage when no current is flowing in the batteries.

In the battery system with a current detection circuit of the present invention, the voltage source circuit 8 can be provided with input switches 14 that switch the test voltage to the input-side of the amplifier 6. When the input switches 14 are in the ON state, the detection circuit 7 can compare input voltage with the reference voltage to detect an open-circuit in the current detection lines 10. In this battery system, when current detection line open-circuit is being detected, the input switches are switched ON and the test voltage is supplied to the input-side of the amplifier. Since the test voltage is not supplied to the input-side of the amplifier when current detection line open-circuit is not being detected, the test voltage can be made large and battery current can still be accurately detected. Accordingly, the test voltage can be made large for reliable detection of current detection line open-circuit. Further, since the input switches are in the OFF state when battery current is being detected, battery current can be detected with high precision.

In the battery system with a current detection circuit of the present invention, the amplifier 6 can be a difference amplifier 6A, and the current detection circuit 2 can be provided with input switches 14 that supply test voltage to both input terminals 6a, 6b of the difference amplifier 6A. In this battery system, since the voltage source circuit can supply test voltage to both input terminals of the difference amplifier, open-circuit can be detected in both of the current detection lines connected to the terminals of the current detection resistor.

In the battery system with a current detection circuit of the present invention, first divider resistors 11 can be connected in series with the current detection lines 10, and second divider resistors 12 can be connected between the output-side of the voltage source circuit 8 and the input-side of the amplifier 6. The test voltage output from the voltage source circuit 8 can be voltage divided by the divider resistors and input to the amplifier 6. In this battery system, since a given voltage is input to the amplifier when the current detection lines are not open-circuited, the system can detect amplifier malfunction in addition to current detection line open-circuit. This is because when the current detection lines are not open-circuited, the detection circuit input voltage is different for a malfunctioning amplifier and for a properly functioning amplifier.

In the battery system with a current detection circuit of the present invention, the amplifier 6 can be a difference amplifier 6A, and the voltage source circuit 8 can supply the same test voltage divided by different voltage divider ratios to the two input terminals 6a, 6b of the difference amplifier 6A.

In this battery system, since a voltage difference is input to the two difference amplifier input terminals when there is no current detection line open-circuit, the system can detect amplifier malfunction in addition to current detection line open-circuit. This is because when there is no current detection line open-circuit, the detection circuit input voltage is different for amplifier malfunction and for proper amplifier operation.

In the battery system with a current detection circuit of the present invention, the current detection circuit 2 can be used to detect charging current and discharging current having different maximum detectable values, and the voltage source circuit 8 can supply bias voltage to shift the zero-input level of the difference amplifier 6A.

The battery system described above can detect battery current more precisely by supplying bias voltage to the input-side of the difference amplifier. In particular, when the maximum discharging current is different from the maximum charging current, battery current can be detected with high precision. This is because the maximum voltage range of the difference amplifier can be narrowed. Further, since the voltage source circuit provided to detect current detection line open-circuit is used to supply bias voltage to the difference amplifier, there is no need to provide special-purpose circuitry to generate bias voltage to improve the current detection accuracy.

The above and further objects of the present invention as well as the features thereof will become more apparent from the following detailed description to be made in conjunction with the accompanying drawings.

DETAILED DESCRIPTION OF THE EMBODIMENT(S)

The following describes embodiments of the present invention based on the figures.

Figure 1:
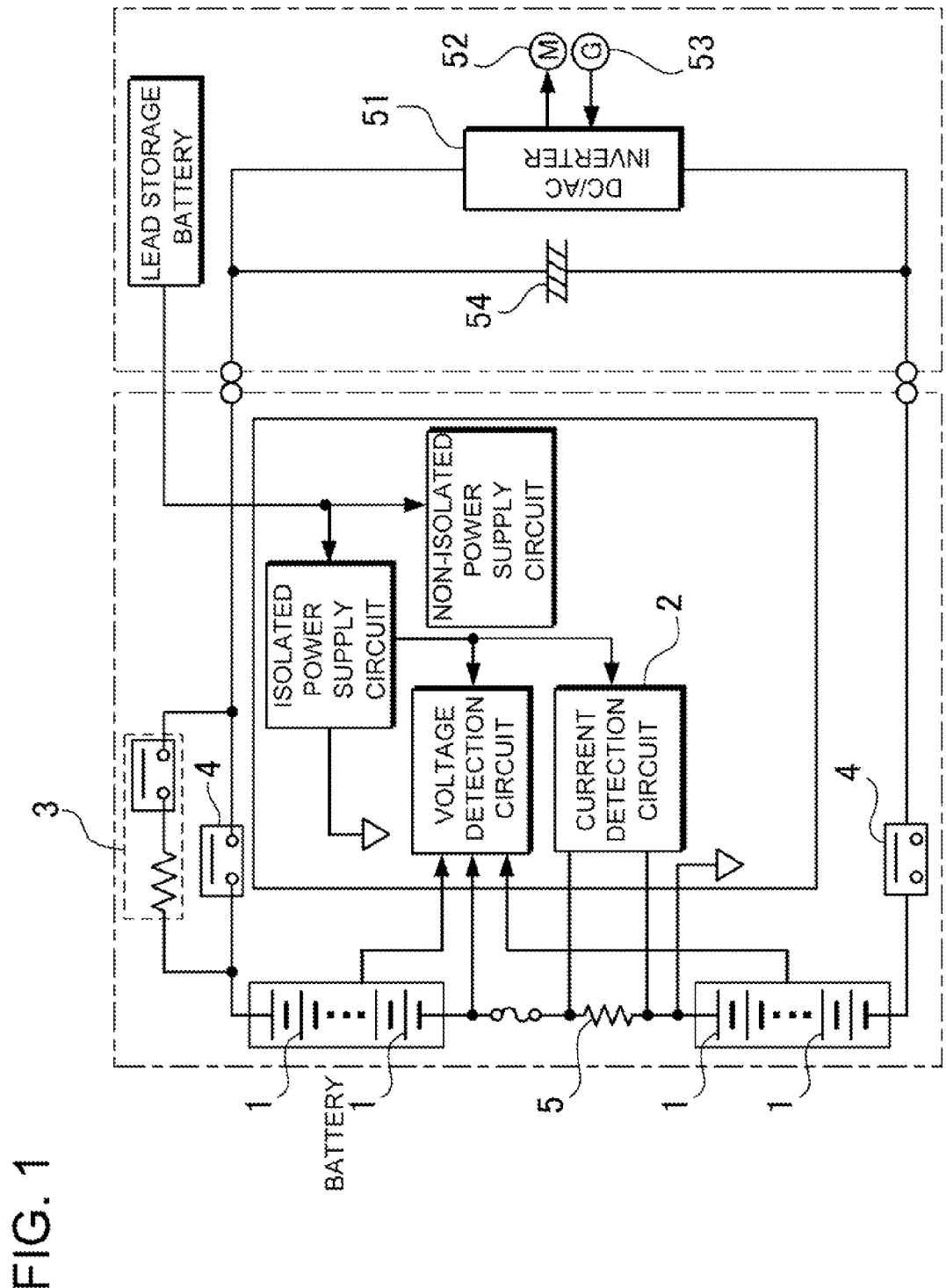
FIG. 1 is an abbreviated system diagram of a battery system with a current detection circuit for an embodiment of the present invention.

FIG. 1 shows a battery system used as a car power source apparatus and more particularly used as a power source apparatus on-board a hybrid car. This battery system detects charging and discharging current of batteries 1 discharged by supplying power to a motor 52 that drives the car, and charged by a generator 53 driven by an engine and regenerative braking. However, the battery system of the present invention is not limited to use as a car power source apparatus. This is because the battery system can be used in any battery system application that detects current with high reliability.

The battery system of FIG. 1 is provided with a current detection circuit 2 that detects current flowing through the batteries 1; main relays 4 that connect the batteries 1 to the direct current-to-alternating current (DC/AC) inverter 51, which is the vehicle-side load; and a pre-charge circuit 3 that pre-charges the high capacitance capacitor 54 connected to the vehicle-side load. The DC/AC inverter 51 is connected to the motor 52 that drives the car and to the generator 53 that charges the batteries 1. The batteries 1 are discharged by supplying power to the motor 52 via the DC/AC inverter 51, and are charged by power from the generator 53 via the DC/AC inverter 51. In this battery system, the maximum discharge current is set by the maximum output of the motor 52 that drives the car, and the maximum charging current is set by the maximum current that charges the batteries 1. The maximum discharging current is set higher than the maximum charging current to increase motor 52 output while reducing battery 1 degradation during charging. For example, in a battery system used as a car power source apparatus, maximum battery 1 discharging current can be 200 A to 300 A, and maximum charging current can be a lower value at 150 A to 200 A. This increases motor 52 output while protecting the batteries 1 and preventing battery 1 degradation during charging.

Further, the battery system of FIG. 1 controls remaining battery 1 capacity within a given range, and detects charging and discharging current flowing through the batteries 1 to control power output to the motor 52. Battery 1 degradation is accelerated by over-charging and over-discharging. Accordingly, by controlling remaining battery 1 capacity within a range such as ±10% to ±30% around a center-point capacity of 50%, battery 1 lifetime can be markedly extended. Remaining battery 1 capacity is calculated by adding the integrated value of the charging current and subtracting the integrated value of the discharging current. Therefore, to accurately determine remaining battery 1 capacity, it is important to accurately detect battery 1 charging current and discharging current. This is because if there is current detection error, remaining capacity cannot be accurately determined, and the batteries 1 can be over-charged or over-discharged.

The battery system of FIG. 1 is provided with a current detection circuit 2 to detect battery 1 current. The current detection circuit 2 shown in FIG. 2 is provided with a current detection resistor 5 connected in series with the batteries 1, an amplifier 6 that amplifies the voltage induced across the current detection resistor 5, and a detection circuit 7 that detects the current flowing through the batteries 1 from the output of the amplifier 6.

Figure 2:
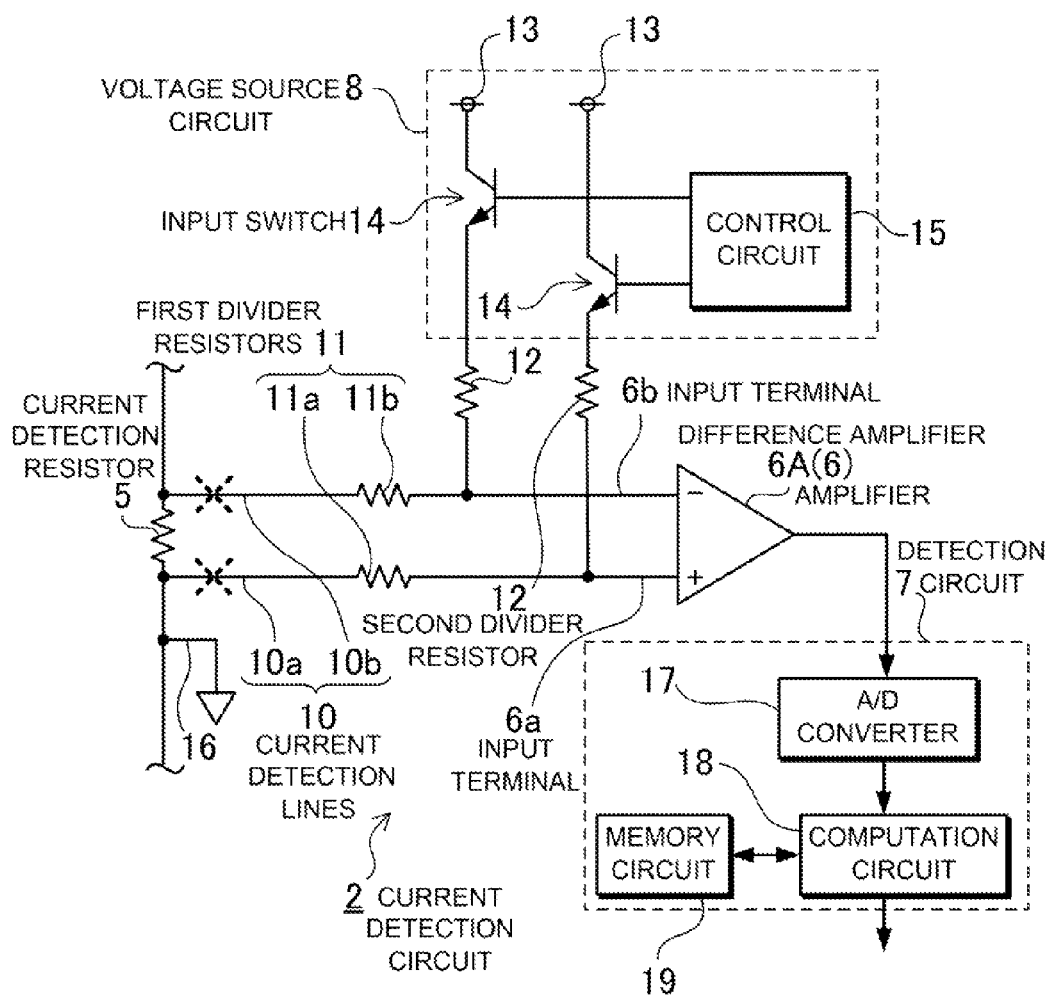
FIG. 2 is a circuit diagram of a current detection circuit for the battery system shown in FIG. 1.

Further, the current detection circuit 2 of FIG. 2 is provided with a voltage source circuit 8 that supplies a test voltage to the input-side of the amplifier 6 to detect open-circuit in the current detection lines 10 connected between the current detection resistor 5 and the input-side of the amplifier 6. The detection circuit 7 stores a reference voltage corresponding to the current detection lines 10 in the connected state (no open-circuit). In this current detection circuit 2, the test voltage is supplied from the voltage source circuit 8 to the input-side of the amplifier 6 when no current is flowing through the batteries 1, for example, immediately after the vehicle ignition switch has been switched ON. Under these conditions, the detection circuit 7 compares the voltage input from the amplifier 6 with the reference voltage, and detects current detection line 10 open-circuit by an input voltage shift from the reference voltage. If the current detection circuit 2 detects an open-circuit in the current detection lines 10, it outputs an unable-to-detect-battery-current signal to the vehicle-side. On the vehicle-side, battery 1 charging and discharging is stopped when battery 1 current cannot be detected. When a battery system on-board a hybrid car is in this state, the vehicle stops operation via the motor 52, stops battery 1 charging, and is in a state that can only be driven by the engine or cannot be driven.

A voltage is induced across the terminals of the current detection resistor 5 that is equal to the product of the current flowing in the batteries 1 and the resistance of the current detection resistor 5. This generates a power loss equal to the product of the current flow and the voltage induced across the current detection resistor 5. To reduce the power loss, the resistance of the current detection resistor 5 is made as small as possible. It is particularly important to make the resistance of the current detection resistor 5 small and reduce power loss in a current detection resistor 5 that detects high currents. Therefore, the resistance of the current detection resistor 5 is set to an extremely low value at or below 1 mΩ. Accordingly, a current detection circuit 2 with a small resistance generates a small voltage, and that small voltage induced across the current detection resistor 5 is amplified by the amplifier 6.

The amplifier 6 amplifies the small voltage induced across the current detection resistor 5 and inputs it to the detection circuit 7. The amplifier 6 outputs a voltage optimally suited for computation by the detection circuit 7. For example, if the resistance of the current detection resistor 5 is 1 mΩ, the gain of the amplifier 6 is 10, and the current flow through the batteries 1 is 100 A, the current detection circuit 2 generates a voltage of 100 mV across the current detection resistor 5, and the output voltage of the amplifier 6 is 1V.

In the current detection circuit 2 of FIG. 2, a difference amplifier 6A is used as the amplifier 6, and the terminals of the current detection resistor 5 are connected to the input terminals 6a, 6b of the amplifier 6 via the current detection lines 10. This difference amplifier 6A amplifies the voltage across the terminals of the current detection resistor 5 and outputs the amplified voltage to the detection circuit 7. The difference amplifier 6A of FIG. 2 has its non-inverting input terminal 6a connected to the ground-line 16 side of the batteries 1, and its inverting input terminal 6b connected to the negative-side of a battery 1. This difference amplifier 6A outputs a positive voltage when detecting battery 1 discharging current, and outputs a negative voltage when detecting battery 1 charging current. The difference amplifier can also be connected with its inverting and non-inverting inputs opposite that shown in the figure. In that case, the difference amplifier outputs a negative voltage when detecting battery discharging current, and outputs a positive voltage when detecting charging current.

The detection circuit 7 processes the difference amplifier 6A output voltage to compute the current flowing in the current detection resistor 5. The detection circuit 7 is provided with an analog-to-digital (ND) converter 17 that converts the analog voltage input from the difference amplifier 6A to a digital signal; and a computation circuit 18 that processes the voltage signal, which is the digital signal output from the ND converter 17, to compute the current detection resistor 5 current, which is the battery 1 current. The computation circuit 18 input voltage is the product of the battery 1 current, the resistance of the current detection resistor 5, and the gain of the difference amplifier 6A. Therefore, the computation circuit 18 determines battery 1 current from the following equation.

$$I = E/(R \times \mu)$$

Here, E is the voltage input to the detection circuit 7, R is the resistance of the current detection resistor 5, and μ is the gain of the difference amplifier 6A.

In addition, the computation circuit 18 distinguishes charging current from discharging current by the sign of the input voltage. In the current detection circuit 2 of FIG. 2, detection circuit 7 input voltage is positive for discharging current and negative for charging current. Accordingly, this computation circuit 18 judges positive input voltage to be, battery 1 discharging current and negative input voltage to be battery 1 charging current.

The current detection circuit 2 is provided with a voltage source circuit 8 that supplies a test voltage to the input-side of the difference amplifier 6A to determine if there is an open-circuit in the current detection lines 10. In FIG. 2, the output-side of the voltage source circuit 8 is connected to both input terminals 6a, 6b of the difference amplifier 6A to input the test voltage across the inverting and non-inverting input terminals 6a, 6b of the difference amplifier 6A. To input a test voltage that develops a voltage across the input terminals 6a, 6b of the difference amplifier 6A, first divider resistors 11 are connected in series with the current detection lines 10, and second divider resistors 12 are connected between the output-side of the voltage source circuit 8 and the input-side of the difference amplifier 6A. The connection nodes between the first divider resistors 11 and the second divider resistors 12 are connected to the inverting and non-inverting input terminals 6a, 6b of the difference amplifier 6A.

The voltage source circuit 8 is provided with input switches 14, which are switching devices, connected between a power supply line 13, which is 5V or 12V for example, and the input-side of the difference amplifier 6A; and a control circuit 15 that controls the input switches 14ON and OFF. The switching devices of the figure are bipolar transistors with collectors connected to the power supply line 13, and emitters connected to the input-side of the difference amplifier 6A through the second divider resistors 12. The control circuit 15 inputs an ON-voltage to the bases of the transistors to control the transistors ON, and inputs an OFF voltage to the bases of the transistors to control the transistors OFF. The control circuit 15 turns both transistors ON at designated times for current detection line 10 open-circuit detection, and turns the transistors OFF after detection. For example, immediately after the ignition switch, which is the main switch in the car, has been switched ON, the control circuit 15 switches the switching devices, which are the input switches 14, ON to detect current detection line 10 open-circuit. After current detection line 10 open-circuit detection, the control circuit 15 switches the switching device input switches 14 OFF to put the system in a state that can detect current.

In the current detection circuit 2 of FIG. 2, the resistance of the first divider resistor 11*a* connected to the non-inverting input 6*a* of the difference amplifier 6A is made smaller than the resistance of the first divider resistor 11*b* connected to the inverting input 6*b*, and the resistance of the two second divider resistors 12 connected to both inputs 6*a*, 6*b* of the difference amplifier 6A are made equal. While supplying a common voltage (5V) from the power supply line 13, this voltage source circuit 8 inputs a test voltage (difference) with the non-inverting input voltage of the difference amplifier 6A lower than the inverting input voltage when there is no open-circuit in the current detection lines 10. This test voltage is amplified by the difference amplifier 6A to set the reference voltage, which is a voltage that does not over-drive (rail) the difference amplifier 6A. Therefore, when there is no current detection line 10 open-circuit, the difference amplifier 6A outputs a voltage equal to the reference voltage.

Figure 3:
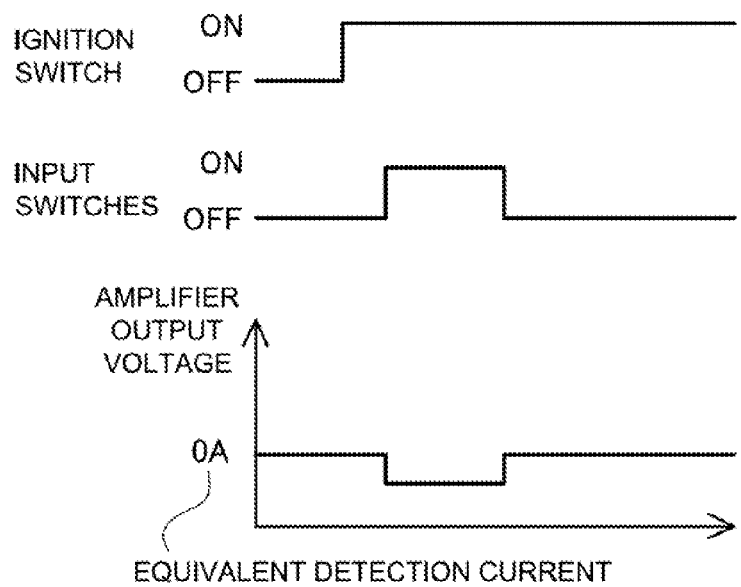
FIG. 3 is a graph showing amplifier output voltage when there is no open-circuit in the current detection lines.
Figure 4:
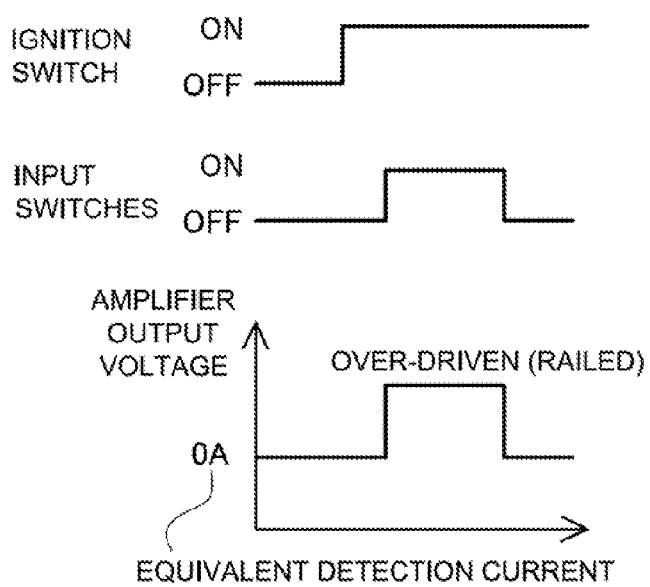
FIG. 4 is a graph showing amplifier output voltage when there is an open-circuit in one of the current detection lines.
Figure 5:
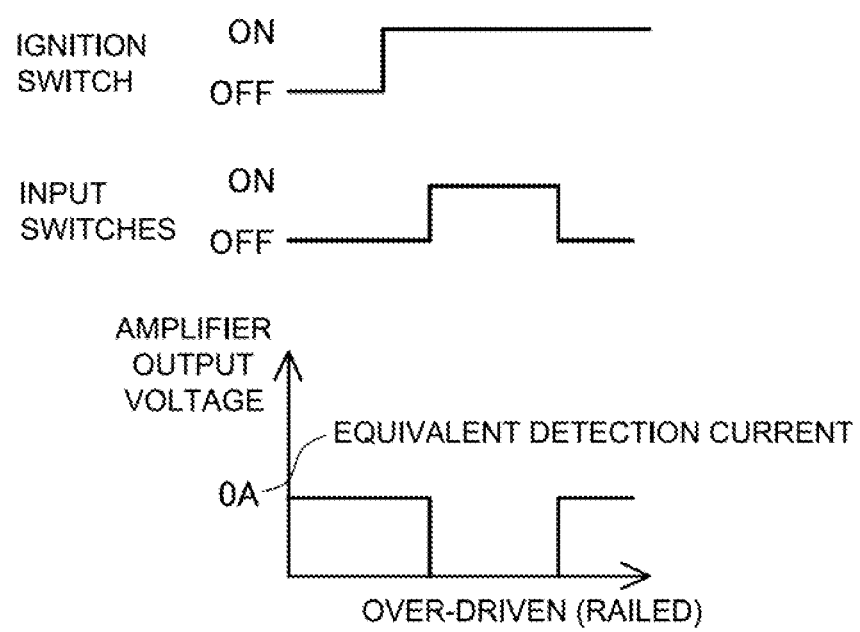
FIG. 5 is a graph showing amplifier output voltage when there is an open-circuit in the other current detection line.

FIGS. 3-5 show difference amplifier 6A output voltage when there is no open-circuit and when there is an open-circuit in the current detection lines 10. FIG. 3 shows voltage conditions when there is no current detection line 10 open-circuit, and FIGS. 4 and 5 show voltage conditions when there is an open-circuit in one of the current detection lines 10.

When there is no open-circuit in either of the current detection lines 10 and the voltage source circuit 8 supplies the test voltage to the input-side of the difference amplifier 6A, the connection nodes between the two current detection lines 10 and the two terminals of the current detection resistor 5 are essentially at the voltage of the ground-line 16, or zero volts. This is because the resistance of the current detection resistor 5 is small and can be neglected compared to the divider resistors and the input impedance of the difference amplifier 6A. Therefore, the voltage input across the non-inverting and inverting inputs of the difference amplifier 6A is the test voltage, which is the voltage difference at the connection nodes between the first divider resistors 11 and the second divider resistors 12. This voltage difference is amplified by the difference amplifier 6A, and the difference amplifier 6A output is the reference voltage. Consequently, when the output voltage of the difference amplifier 6A is the reference voltage, the current detection lines 10 can be judged to have no open-circuit.

When there is an open-circuit in one of the current detection lines 10, the voltage at the difference amplifier 6A input connected to the open-circuited current detection line 10 becomes the input switch 14 power supply line 13 voltage, which is an extremely high voltage such as 5V or 12V. This is because the open-circuited current detection line 10 becomes disconnected from the ground-line 16. FIG. 4 shows voltage conditions when the current detection line 10*a* connected to the non-inverting input 6*a* of the difference amplifier 6A is open-circuited. When this current detection line 10*a* is open-circuited, the voltage at the non-inverting input 6*a* of the difference amplifier 6A rises approximately to the power supply line 13 voltage. As a result, the difference amplifier 6A outputs a voltage that is over-driven in the positive direction (at the positive power supply rail). Consequently, when the difference amplifier 6A output is over-driven in the positive direction, the current detection line 10*a* connected to the non-inverting input 6*a* of the difference amplifier 6A can be judged to have an open-circuit. FIG. 5 shows voltage conditions when the current detection line 10*b* connected to the inverting input 6*b* of the difference amplifier 6A is open-circuited. When this current detection line 10*b* is open-circuited, the voltage at the inverting input 6*b* of the difference amplifier 6A rises approximately to the power supply line 13 voltage. As a result, the difference amplifier 6A outputs a voltage that is over-driven in the negative direction (at the negative power supply rail). Consequently, when the difference amplifier 6A output is over-driven in the negative direction, the current detection line 10*b* connected to the inverting input 6*b* of the difference amplifier 6A can be judged to have an open-circuit.

Difference amplifier 6A output is input to the detection circuit 7 to determine if there is an open-circuit in the current detection lines 10. The detection circuit 7 stores the reference voltage for detecting current detection line 10 open-circuit in a memory circuit 19. The computation circuit 18 compares the voltage input from the difference amplifier 6A with the reference voltage supplied by the memory circuit 19, and judges that there is no open-circuit in the current detection lines 10 if the input voltage is equal to the reference voltage. The computation circuit 18 compares the input voltage with the reference voltage, if the input voltage is within a set range around the reference voltage, for example, within a range 10% to 20% above and below the reference voltage, the current detection lines 10 are judged to have no open-circuit. If the magnitude of the input voltage is lower than the magnitude of the reference voltage, the computation circuit 18 judges that the difference amplifier 6A or the A/D converter 17 has malfunctioned. Further, if the magnitude of the input voltage is greater than the magnitude of the reference voltage, the computation circuit 18 judges that there is an open-circuit in the current detection lines 10. As shown in FIG. 4, when the magnitude of the input voltage is greater than the magnitude of the reference voltage and is on the positive voltage side (over-driven [railed] to the positive-side in FIG. 4), the computation circuit 18 judges the current detection line 10*a* connected to the non-inverting input of the difference amplifier 6A to be open-circuited. As shown in FIG. 5, when the magnitude of the input voltage is greater than the magnitude of the reference voltage and is on the negative voltage side (over-driven [railed] to the negative-side in FIG. 4), the computation circuit 18 judges the current detection line 10*b* connected to the inverting input of the difference amplifier 6A to be open-circuited.

In the current detection circuit 2 described above, the switching devices, which are the input switches 14, are switched ON to supply the test voltage to the amplifier 6 only during current detection line 10 open-circuit detection. The current detection circuit 22 of FIG. 6 has no input switches, and the voltage source circuit 28 continuously supplies a test voltage to the input-side of the amplifier 26 to detect current detection line 10 open-circuit. In this current detection circuit 22, current detection line 10 open-circuit can always be detected when no current is flowing through the current detection resistor 5. The voltage source circuit 28 is provided with a series resistor 23 that inputs the test voltage to the input-side of the amplifier 26. One side of the series resistor 23 is connected to the input-side of the amplifier 26, and the other side is connected to the power supply line 13. The series resistor 23 has a resistance sufficiently larger than the current detection resistor 5, and for example, a 10KΩ resistor is used. In addition, the current detection circuit 22 of the figure has a parallel resistor 24 connected in parallel with the current detection resistor 5. The parallel resistor 24 also has a resistance sufficiently larger than the current detection resistor 5, and for example, a 2.7KΩ resistor is used. However, the parallel resistor and series resistor can also have resistances different from those indicated above. In particular, the parallel resistor can also have infinite resistance, namely the parallel resistor may not be connected.

The resistance of the series resistor 23, the resistance of the parallel resistor 24, and the power supply line 13 voltage supplied to the series resistor 23 set the test voltage supplied to the input-side of the amplifier 26. The test voltage supplied to the input-side of the amplifier 26 via the series resistor 23 is set to a voltage that does not generate current detection error while still enabling input of the test voltage. The current detection circuit 22 converts the amplifier 26 output voltage to a digital signal via the A/D converter 17 to compute current with the computation circuit 18. When the analog voltage is converted to a digital signal by the ND converter 17, quantization error is generated that does not allow detection accuracy better than the resolution of the least-significant-bit (LSB) of the A/D converter 17. By making the test voltage less than the quantization error, current can be detected without inducing error while continuously supplying the test voltage to the amplifier 26.

Figure 6:
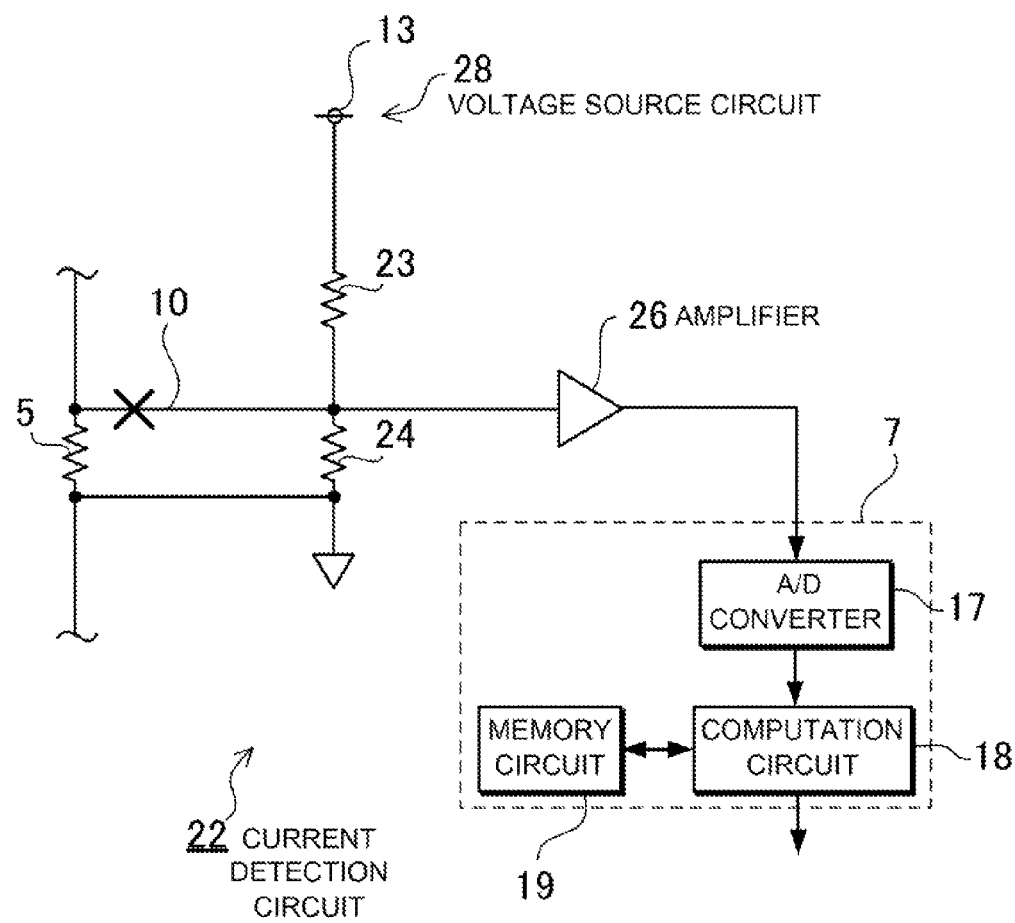
FIG. 6 is a circuit diagram showing another example of a current detection circuit.

For example, in FIG. 6, if the resistance of the current detection resistor 5 is 0.5 mΩ, the resistance of the series resistor 23 is 10 kΩ, and the voltage of the power supply line 13 that supplies voltage to the series resistor 23 is 5V, the voltage source circuit 28 supplies a test voltage of 0.25 μV to the input-side of the amplifier 26. The value of one LSB of a 16-bit A/D converter 17 is 1/32768 times the maximum voltage (½ full-scale). Therefore, for a maximum detection current of 257 A, the resolution of one LSB is 257 A/32768 or 7.8 mA/LSB. Here, the test voltage supplied to the input-side of the amplifier 26 is 0.25 μV, which is equivalent to 0.5 mA of detection current through the 0.5 mΩ current detection resistor 5. Specifically, the 0.25 μV test voltage converts to an equivalent detection current of 0.5 mA, but this value is significantly less than the value of one LSB, which is 7.8 mA, and has no practical effect on the current detection error.

If the current detection circuit 22 of FIG. 6 has an open-circuited current detection line 10 at the x-mark in the figure, the voltage input to the amplifier 26 is power supply line 13 voltage (5V) voltage divided by the parallel resistor 24 (2.7KΩ) and the series resistor 23 (10KΩ) or 1.063V. This voltage converts to an equivalent detection current of 2126 A, which is outside the range of the A/D converter 17. Consequently, when there is no current detection line 10 open-circuit, current is detected normally. However, when the current detection line 10 is open-circuited, the input voltage is over-range. The detection circuit 7 detects an over-range voltage input from the amplifier 26 and judges the current detection line 10 to be open-circuited.

Further, when the maximum detection range of the charging current and the discharging current are different, the current detection circuit 2 of FIG. 2 can detect current more accurately by using the voltage source circuit 8 to input bias voltage to shift the zero-input level of the difference amplifier 6A. For example, when the maximum detectable discharging current is 250 A, the maximum detectable charging current is 150 A, and no bias voltage is supplied for level-shift, it is necessary to detect ±250 A of current or current in a 500 A range. When current in a 500 A range is converted to a digital signal by a 14-bit A/D converter, the resolution of one LSB is 500 A/8192 or 61 mA/LSB. However, if the zero-input level of the amplifier 6 is shifted to detect current in a range from −150 A to +250 A, the full-scale range of the amplifier 6 becomes equivalent to 400 A of current. When current in a 400 A range is converted to a digital signal by a 14-bit A/D converter, the resolution of one LSB becomes 400 A/8192 or 49 mA/LSB and this increases the resolution allowing more precise current detection. In particular, this current detection circuit 2 has the characteristic that current can be detected more precisely for different maximum charging and discharging currents without the use of an expensive high-resolution ND converter.

Figure 7:
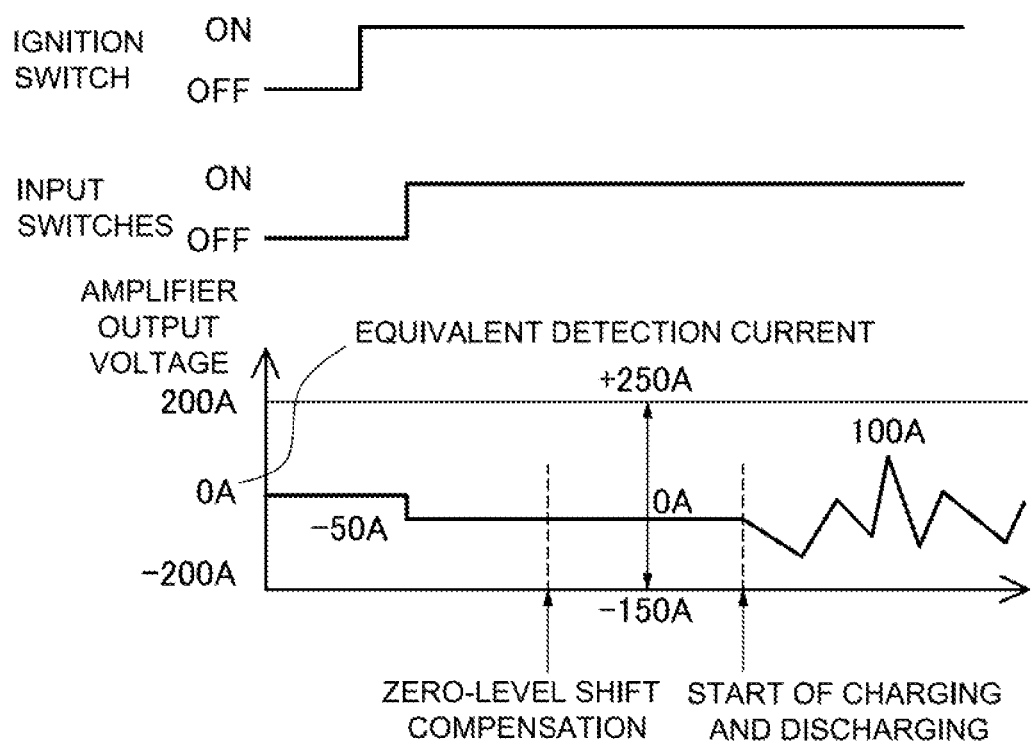
FIG. 7 is a graph showing the test voltage used as bias voltage to detect current with high precision.

FIG. 7 is a graph showing the test voltage input as bias voltage to detect current with high precision while detecting current detection line 10 open-circuit. As shown in this figure, by inputting the test voltage as a bias voltage to the input-side of the amplifier 6, the zero-level for current detection is shifted to a level equivalent to a current of −50 A. Specifically, the test voltage is input as bias voltage that shifts the zero-level for current detection to the negative-side by a level-shift equivalent to 50 A of detection current. When no current flows through the current detection resistor 5, the amplifier 6 has its zero-level shifted to a negative voltage by the test voltage. Namely, the test voltage inputs a voltage to the non-inverting-side of the difference amplifier 6A that is lower than the voltage input to the inverting-side to input a negative bias voltage to the amplifier 6. In the current detection circuit 2 of FIG. 2, the resistance of the first divider resistor 11b connected to the inverting-side of the difference amplifier 6A is made larger than the resistance of the first divider resistor 11a connected to the non-inverting-side to input a higher voltage to the inverting-side of the difference amplifier 6A than to the non-inverting-side. Accordingly, when the voltage induced across the current detection resistor 5 is 0V, a negative bias voltage is input to the difference amplifier 6A.

In FIG. 7, a voltage equivalent to that induced across the current detection resistor 5 with 50 A of current flow is input to the difference amplifier 6A by the test voltage to shift the zero-level detection current by 50 A. The bias voltage corresponding to a 50 A shift in the zero-level detection current is 25 mV for a current detection resistor 5 resistance of 0.5 mΩ. Accordingly, the voltage source circuit 8 can supply a test voltage as bias voltage that is 25 mV higher at the inverting input of the difference amplifier 6A than at the non-inverting input, or is 25 mV lower at the non-inverting input than at the inverting input, to shift the zero-level detection current by 50 A. This current detection circuit 2 can accurately detect 250A of discharging current and 150 A of charging current with a maximum current detection range of 400 A. In this current detection circuit 2, the computation circuit 18, which computes current from the digitized voltage output from the A/D converter 17, compensates for the zero-level shift to accurately compute the battery 1 current.

In the current detection circuit 2 of FIG. 2 with bias voltage supplied to the input-side of the difference amplifier 6A, when one of the current detection lines 10 is open-circuited, amplifier 6 output voltage becomes either a positive or negative over-range voltage, and the open-circuited current detection line 10 can be detected. Further, in the current detection circuit with the zero-level shifted by bias voltage supplied by the voltage source circuit 8, the bias voltage is continuously supplied to the input-side of the amplifier 6 to detect battery 1 current. Specifically, in the current detection circuit 2 of FIG. 2, the switching devices, which are the input switches 14, are maintained in the ON state even when detecting battery 1 current. Accordingly, the current detection circuit 2 with the amplifier 6 zero-level shifted via bias voltage does not necessarily require input switches, and battery 1 current is detected while continuously supplying the test voltage to the input-side of the difference amplifier 6A.

The battery system described above is used as a car battery system. A vehicle with this battery system on-board can be an electric-powered vehicle such as a hybrid car (hybrid vehicle, EV) that is driven by both an engine and an electric motor, a plug-in hybrid car, or an electric automobile (electric vehicle, EV) that is driven only by an electric motor. The battery system is used as a power source on-board these vehicles.

Figure 8:
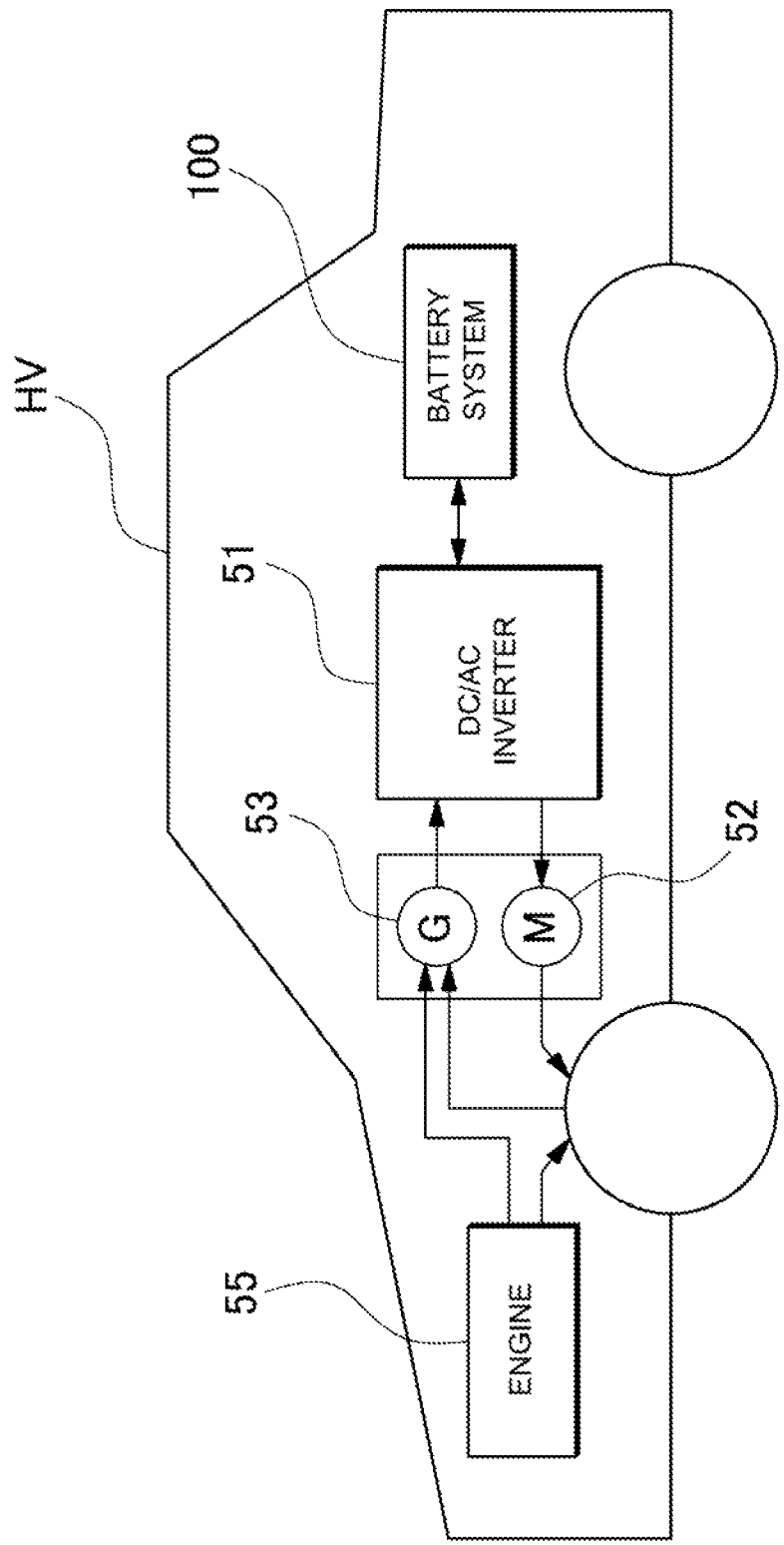
FIG. 8 is an abbreviated diagram showing one example of an embodiment of a vehicle with the battery system of the present invention on-board.

FIG. 8 shows an example of a hybrid car driven by both an engine 55 and an electric motor 52 and having a battery system 100 installed on-board. The vehicle HV shown in this figure is provided with an engine 55 and a motor 52 that drive the vehicle, a battery system 100 that supplies power to the motor 52, and a generator 53 that charges the battery system 100 batteries. The battery system 100 is connected to the motor 52 and generator 53 via a DC/AC inverter 51. The vehicle HV is driven by both the motor 52 and the engine 55 while charging and discharging the battery system 100 batteries. The motor 52 is activated to drive the vehicle during inefficient modes of engine operation such as during acceleration and slow speed operation. The motor 52 is operated by power supplied from the battery system 100. The generator 53 is driven by the engine 55 or by regenerative braking during vehicle deceleration to charge the battery system 100 batteries.

Figure 9:
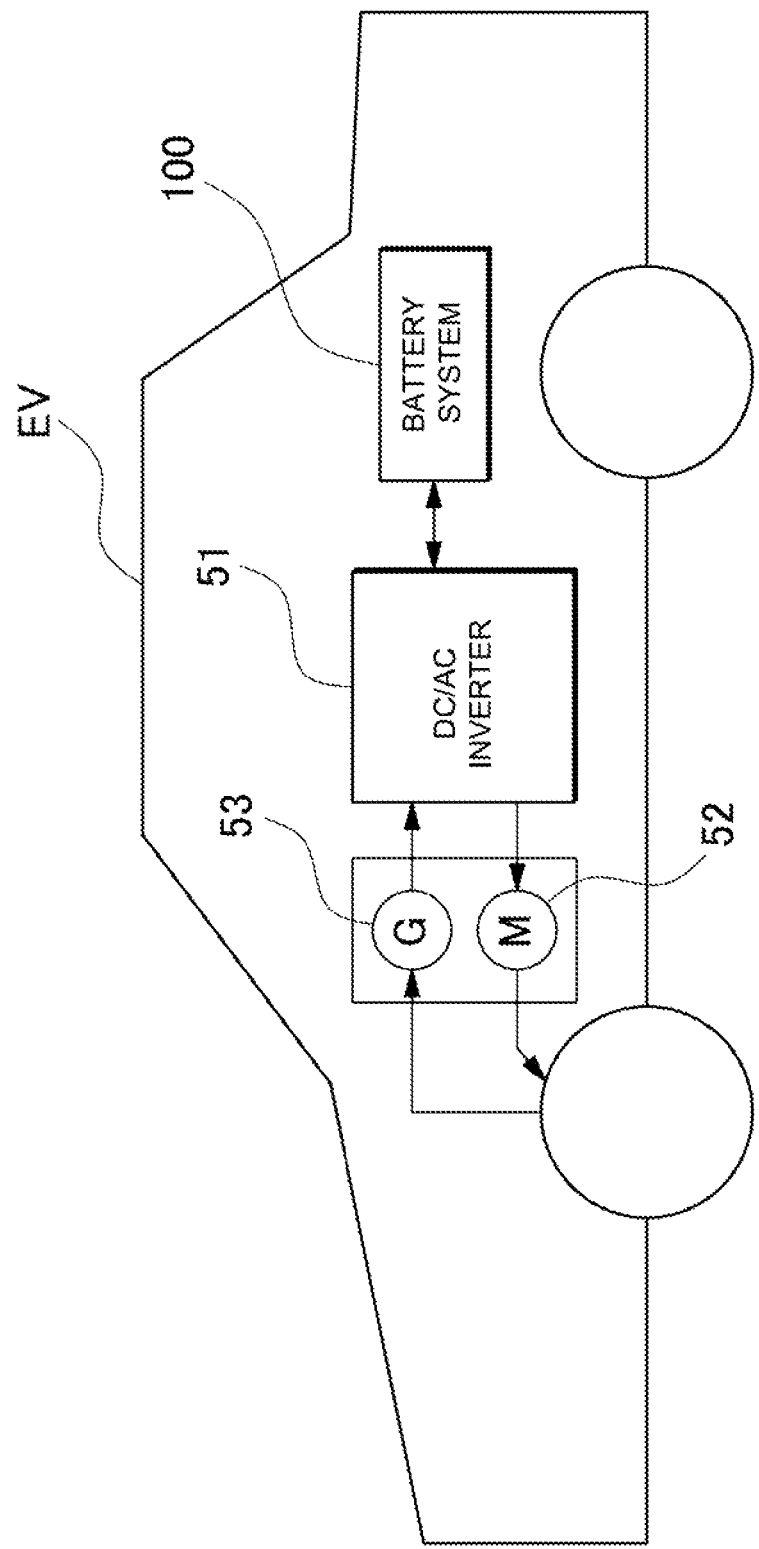
FIG. 9 is an abbreviated diagram showing another example of an embodiment of a vehicle with the battery system of the present invention on-board.

FIG. 9 shows and example of an electric vehicle driven only by a motor 52 and having a battery system 100 installed on-board. The vehicle EV shown in this figure is provided with a motor 52 that drives the vehicle, a battery system 100 that supplies power to the motor 52, and a generator 53 that charges the battery system 100 batteries. The motor 52 is operated by power supplied from the battery system 100. The generator 53 is driven by energy from regenerative braking to charge the battery system 100 batteries.

The battery system with a current detection circuit of the present invention is favorably suited for use as a car battery system in a hybrid car or electric vehicle. Further, the battery system is also favorably suited for use as a battery system in applications other than automotive applications.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2009-206281 filed in Japan on Sep. 7, 2009, the content of which is incorporated herein by reference.

What is claimed is:

1. A battery system provided with batteries and a current detection circuit comprising:
   a current detection resistor connected in series with the batteries;
   an amplifier that amplifies voltage induced across the terminals of the current detection resistor;
   a detection circuit that detects the current flowing through the batteries from the amplifier output; and
   a voltage source circuit that supplies a test voltage to the input-side of the amplifier,
   wherein current detection lines connect the current detection resistor with the input-side of the amplifier, and the detection circuit stores a reference voltage corresponding to the current detection lines in the connected state,
   when the test voltage is supplied to the input-side of the amplifier from the voltage source circuit, the detection circuit compares the voltage input from the amplifier with the stored reference voltage, and detects current detection line open-circuit by the shift in voltage from the reference voltage.

2. The battery system as cited in claim 1 wherein the voltage source circuit is provided with input switches that switch the test voltage to the input-side of the amplifier, when the input switches are in the ON state, the detection circuit compares its input voltage with the reference voltage to detect current detection line open-circuit.

3. The battery system as cited in claim 2 wherein the voltage source circuit is provided with a control circuit, and the control circuit switches the input switches ON during time-intervals allotted for detection of current detection line open-circuit.

4. The battery system as cited in claim 3 used as a car power source apparatus wherein after the ignition switch, which is the main switch in the car, has been switched ON, the control circuit switches the input switches ON to detect current detection line open-circuit.

5. The battery system as cited in claim 2 wherein the amplifier is a difference amplifier, and the voltage source circuit is provided with input switches that input test voltage to both input terminals of the difference amplifier.

6. The battery system as cited in claim 5 wherein the voltage source circuit is provided with input switches that input test voltage to both input terminals of the difference amplifier, and a control circuit that controls the input switches ON and OFF; and the control circuit switches both input switches ON during time-intervals allotted for detection of current detection line open-circuit.

7. The battery system as cited in claim 5 wherein the difference amplifier non-inverting input terminal is connected to the ground-line-side of the batteries and the inverting input terminal is connected to the negative-side of a battery.

8. The battery system as cited in claim 5 wherein the voltage source circuit supplies test voltage across the inputs of the difference amplifier, which is a lower voltage at the non-inverting input than at the inverting input.

9. The battery system as cited in claim 1 wherein first divider resistors are connected in series with the current detection lines, second divider resistors are connected between the output-side of the voltage source circuit and the input-side of the amplifier, and the test voltage output from the voltage source circuit is voltage divided by the divider resistors and input to the amplifier.

10. The battery system as cited in claim 9 wherein the amplifier is a difference amplifier, and the voltage source circuit inputs test voltage divided by different voltage divider ratios to the two input terminals of the difference amplifier.

11. The battery system as cited in claim 10 wherein the voltage source circuit supplies the same test voltage divided by different voltage divider ratios to the two input terminals of the difference amplifier.

12. The battery system as cited in claim 1 wherein the detection circuit is provided with an A/D converter that converts the analog voltage input from the difference amplifier to a digital signal, and a computation circuit that computes the current flowing through the batteries from the digitized voltage signal output from the ND converter;
   if the magnitude of the input voltage is lower than the magnitude of the reference voltage, the computation circuit judges that either the difference amplifier or the A/D converter has malfunctioned.

13. The battery system as cited in claim 12 wherein the computation circuit judges that there is an open-circuit in the current detection lines if the magnitude of the input voltage is greater than the magnitude of the reference voltage.

14. The battery system as cited in claim 1 wherein the current detection circuit detects charging current and discharging current having different maximum detectable current values, and the voltage source circuit supplies bias voltage to shift the zero-input level of the difference amplifier.

15. The battery system as cited in claim 1 wherein the voltage source circuit is provided with a series resistor that inputs the test voltage to the input-side of the amplifier, one side of the series resistor is connected to the input-side of the amplifier, the other side is connected to the power supply line, and the series resistor has a resistance sufficiently larger than the current detection resistor.

16. The battery system as cited in claim 15 wherein the current detection circuit has a parallel resistor connected in parallel with the current detection resistor, and the parallel resistor has a resistance sufficiently larger than the current detection resistor.

17. The battery system as cited in claim 16 wherein the detection circuit is provided with an A/D converter that converts input analog signals to digital signals, and the test voltage supplied by the voltage source circuit through the series resistor to the input-side of the amplifier is a voltage smaller than the quantization error of the A/D converter.

* * * * *